(12) United States Patent
Furukawa et al.

(10) Patent No.: US 11,333,697 B2
(45) Date of Patent: May 17, 2022

(54) THREE-DIMENSIONAL SURFACE POTENTIAL DISTRIBUTION MEASUREMENT SYSTEM

(71) Applicants: TOSHIBA MITSUBISHI-ELECTRIC INDUSTRIAL SYSTEMS CORPORATION, Chuo-ku (JP); THE UNIVERSITY OF TOKYO, Bunkyo-ku (JP)

(72) Inventors: Masaaki Furukawa, Tokyo (JP); Tetsuo Yoshimitsu, Tokyo (JP); Yuichi Tsuboi, Tokyo (JP); Kunihiko Hidaka, Tokyo (JP); Akiko Kumada, Tokyo (JP); Hisatoshi Ikeda, Tokyo (JP)

(73) Assignees: TOSHIBA MITSUBISHI-ELECTRIC INDUSTRIAL SYSTEMS CORPORATION, Chuo-ku (JP); THE UNIVERSITY OF TOKYO, Bunkyo-ku (JP)

( * ) Notice: Subject to any disclaimer, the term of this patent is extended or adjusted under 35 U.S.C. 154(b) by 488 days.

(21) Appl. No.: 16/058,475

(22) Filed: Aug. 8, 2018

(65) Prior Publication Data

US 2018/0348276 A1 Dec. 6, 2018

Related U.S. Application Data

(63) Continuation of application No. PCT/JP2016/000643, filed on Feb. 8, 2016.

(51) Int. Cl.
*G01R 29/14* (2006.01)
*G01R 29/08* (2006.01)
(Continued)

(52) U.S. Cl.
CPC ........... *G01R 29/14* (2013.01); *G01R 15/242* (2013.01); *G01R 29/08* (2013.01); *G01R 31/34* (2013.01)

(58) Field of Classification Search
CPC ........ G01R 29/14; G01R 29/08; G01R 31/34; G01R 15/242
See application file for complete search history.

(56) References Cited

U.S. PATENT DOCUMENTS 4,300,198 A * 11/1981 Davini ................ B05B 13/0431
                                                         318/568.14
7,577,498 B2 * 8/2009 Jennings ................ B25J 9/0084
                                                         141/100
(Continued)

FOREIGN PATENT DOCUMENTS

CA        2 907 558 A1    9/2014
CA        2 951 382 A1    12/2015
(Continued)

OTHER PUBLICATIONS

Office Action dated Jun. 17, 2019 in Canadian Patent Application No. 3,013,883, 4 pages.
(Continued)

*Primary Examiner* — Jeff W Natalini
(74) *Attorney, Agent, or Firm* — Oblon, McClelland, Maier & Neustadt, L.L.P.

(57) ABSTRACT

A three-dimensional surface potential distribution measurement system for measuring a surface potential of a measurement object comprises: a laser light source; a Pockels crystal exhibiting Pockels effect in which a refractive index changes depending on potential difference between the first end surface and the second end surface; a mirror disposed so as to be attached stationarily to the second end surface of the Pockels crystal; a photodetector to detect a light intensity of the laser light corresponding to the potential difference of the
(Continued)

Pockels crystal; a housing that holds those elements; a three-dimensional motion-driver capable of three-dimensionally moving the housing; and a driving controller that controls the three-dimensional motion-driver.

4 Claims, 10 Drawing Sheets

(51) Int. Cl.
*G01R 31/34* (2020.01)
*G01R 15/24* (2006.01)

(56) References Cited

U.S. PATENT DOCUMENTS

| | | | | |
|---|---|---|---|---|
| 9,702,915 | B2* | 7/2017 | Tsuboi | G01R 15/242 |
| 10,041,980 | B2* | 8/2018 | Furukawa | G01R 29/14 |
| 2004/0027139 | A1* | 2/2004 | Pettersson | G01D 5/2412 |
| | | | | 324/661 |
| 2007/0040118 | A1* | 2/2007 | Cheng | H01J 37/28 |
| | | | | 250/310 |
| 2010/0153033 | A1* | 6/2010 | Schaus | G01R 31/311 |
| | | | | 702/57 |
| 2014/0300368 | A1 | 10/2014 | Tsuboi et al. | |
| 2015/0138538 | A1* | 5/2015 | Sakurai | G01J 3/26 |
| | | | | 356/72 |
| 2016/0041215 | A1 | 2/2016 | Furukawa et al. | |
| 2017/0160314 | A1 | 6/2017 | Furukawa et al. | |

FOREIGN PATENT DOCUMENTS

| | | |
|---|---|---|
| EP | 2 977 775 A1 | 1/2016 |
| JP | 4-213082 | 8/1992 |
| JP | 6-8174 | 1/1994 |
| JP | 2013-113637 | 6/2013 |
| JP | WO 2014/147660 A1 | 9/2014 |

OTHER PUBLICATIONS

Extended European Search Report dated Aug. 23, 2019 in Patent Application No. 16889743.7, 7 pages.
International Search Report dated Apr. 26, 2016 in PCT/JP2016/000643, filed on Feb. 8, 2016 (with English Translation).
Canadian Office Action dated Jun. 9, 2020 in Canadian Patent Application No. 3,013,883, 3 pages.
Office Action dated Mar. 19, 2021 in Canadian Patent Application No. 3,013,883.

* cited by examiner

THREE-DIMENSIONAL SURFACE POTENTIAL DISTRIBUTION MEASUREMENT SYSTEM

CROSS-REFERENCE TO RELATED APPLICATION

The present application is based upon and claims the benefit of priority from International Application No. PCT/JP2016/000643 filed on Feb. 8, 2016, the entire content of which is incorporated herein by reference.

FIELD

The present invention relates to a three-dimensional surface potential distribution measurement system.

BACKGROUND

An inverter drive system that uses an inverter to drive a rotating electrical machine such as an electric motor has been developed and is becoming popular. In such an inverter driver system, the inverter converts a DC voltage into a pulse voltage by switching operation and supplies the pulse voltage to the rotating electrical machine through cables. The rotating electrical machine is driven by the pulse voltage.

In a system using a series parts in a coil such as a rotating electrical machine coil, sharing voltage of each part on the surface of a coil of an actual machine after impregnation needs to be measured in a non-contact manner since a terminal between both ends of each part of the coil cannot be taken out with conductors. Further, a voltage signal in a high-frequency region is difficult to acquire in measurement using a conventional non-contact surface electrometer.

PRIOR ART DOCUMENTS

Patent Documents

Patent Document 1: Japanese Patent Application Laid-Open Publication No. 2013-113637

SUMMARY OF THE INVENTION

Problems to be Solved by the Invention

Focusing on the voltage distribution of the series coil at start-up, when the rise of a voltage of a power feeding line is sufficiently slower than propagation of a voltage in the series coil in the longitudinal direction thereof, the voltage sharing rate is substantially equalized among conductors of the coil. On the other hand, when the rise of a voltage of a feeding line is sufficiently faster than propagation of the voltage in the series coil in the longitudinal direction thereof, following of a voltage on the exit side of the coil is relatively slower than the rise of a voltage on the entrance side of the coil in an upstream side coil closest to the feeding line. Accordingly, the voltage on the coil exit side does not sufficiently rise relative to that on the entrance side. As a result, a potential difference transiently applied to entrance side of the coil becomes large, or the voltage sharing rate of the entrance side increases transiently.

In particular, an inverter pulse voltage by the inverter drive system rises fast, so that the voltage sharing rate at a part close to the feeding line increases. Thus, it is necessary to take countermeasures against overvoltage. For countermeasures against overvoltage, measurement of a transient voltage distribution at application of the inverter pulse voltage is important.

A surface electrometer is used in general for measurement of a surface potential. For example, there is known a technique to estimate current-voltage characteristics using a surface potential which is measured by the surface electrometer with a probe brought into contact with or close to an electric field relaxation system. However, the inverter pulse voltage has a high-frequency component of kHz order or more. In this case, the surface electrometer cannot follow the above high-frequency component.

As a surface potential measuring means that follows the high-frequency component, a method using a Pockels crystal is known (Refer to Patent Document 1).

On the other hand, when measuring a sharing voltage on the surface of a coil of an actual machine after impregnation in a system using a series coil, e.g., a rotating electrical machine coil, a part of each stator coil conductor near a connection portion is three-dimensionally changed in shape, so that a distance from an object of measurement varies in a method that moves the surface potential measuring means uniformly outside an insulating material. Thus, a condition may differ from place to place, and therefore an identical calibration curve cannot be used.

An object of the present invention is to allow a system using series parts in a coil to measure a sharing voltage on the surface of a coil of an actual machine after impregnation in a test that applies a voltage including a high-frequency component.

Means for Solving the Problem

According to the present invention, there is provided a three-dimensional surface potential distribution measurement system for measuring a surface potential of a measurement object, the system comprising: a laser light source to emit laser light; a Pockels crystal having a first end surface and a second end surface, exhibiting Pockels effect in which a refractive index changes depending on potential difference between the first end surface and the second end surface, disposed such that the first end surface faces a side that the laser light emitted from the laser light source enters while the second end surface faces the measurement object, and extending in a longitudinal direction along a propagation direction of the laser light; a mirror disposed on the second end surface and configured to reflect the laser light incident from the first end surface of the Pockels crystal in a direction opposite to the laser light incident direction; a photodetector having a band following a high-frequency component of an inverter pulse voltage and configured to receive the laser light reflected by the mirror to detect a light intensity of the laser light corresponding to the potential difference between the first end surface and the second end surface of the Pockels crystal; a housing that holds the laser light source, the Pockels crystal, the mirror, and the photodetector while maintaining the relative positional relationship thereamong; a three-dimensional motion-driver capable of three-dimensionally moving the housing; and a driving controller that controls the three-dimensional motion-driver.

Advantage of the Invention

According to the present invention, it is possible to allow a system using series parts in a coil to measure a sharing voltage on the surface of a coil of an actual machine after impregnation in a test that applies a voltage including a high-frequency component.

EMBODIMENTS FOR CARRYING OUT THE INVENTION

Figure 1:
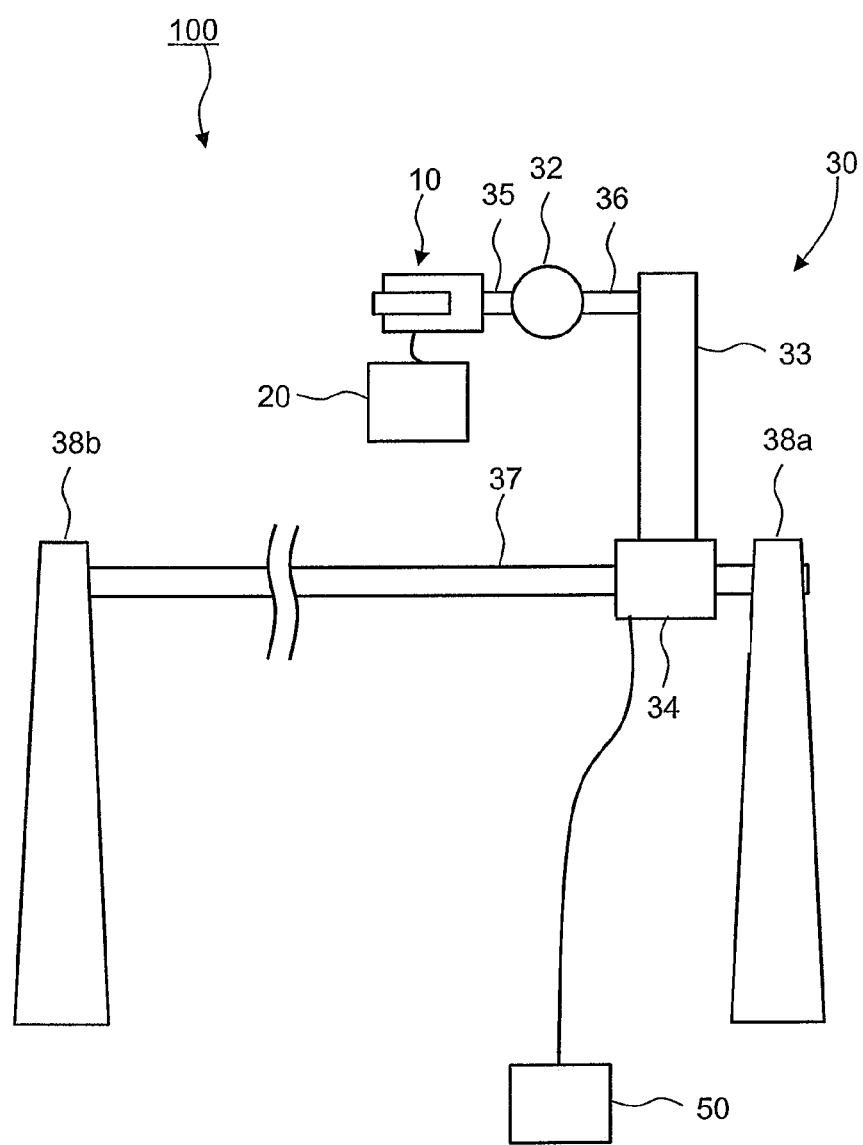
FIG. 1 is a side view illustrating the configuration of a three-dimensional surface potential distribution measurement system according to an embodiment.

Embodiments of a three-dimensional surface potential distribution measurement apparatus according to the present invention will be described with reference to the drawings. Throughout the description, the same reference numerals are given to the same or similar parts, and repeated description will be omitted.

FIG. 1 is a side view illustrating the configuration of a three-dimensional surface potential distribution measurement system according to an embodiment. A three-dimensional surface potential distribution measurement system 100 includes a measurement device 70 (FIG. 2), a three-dimensional motion-driver 30, and a driving controller 50.

Figure 2:
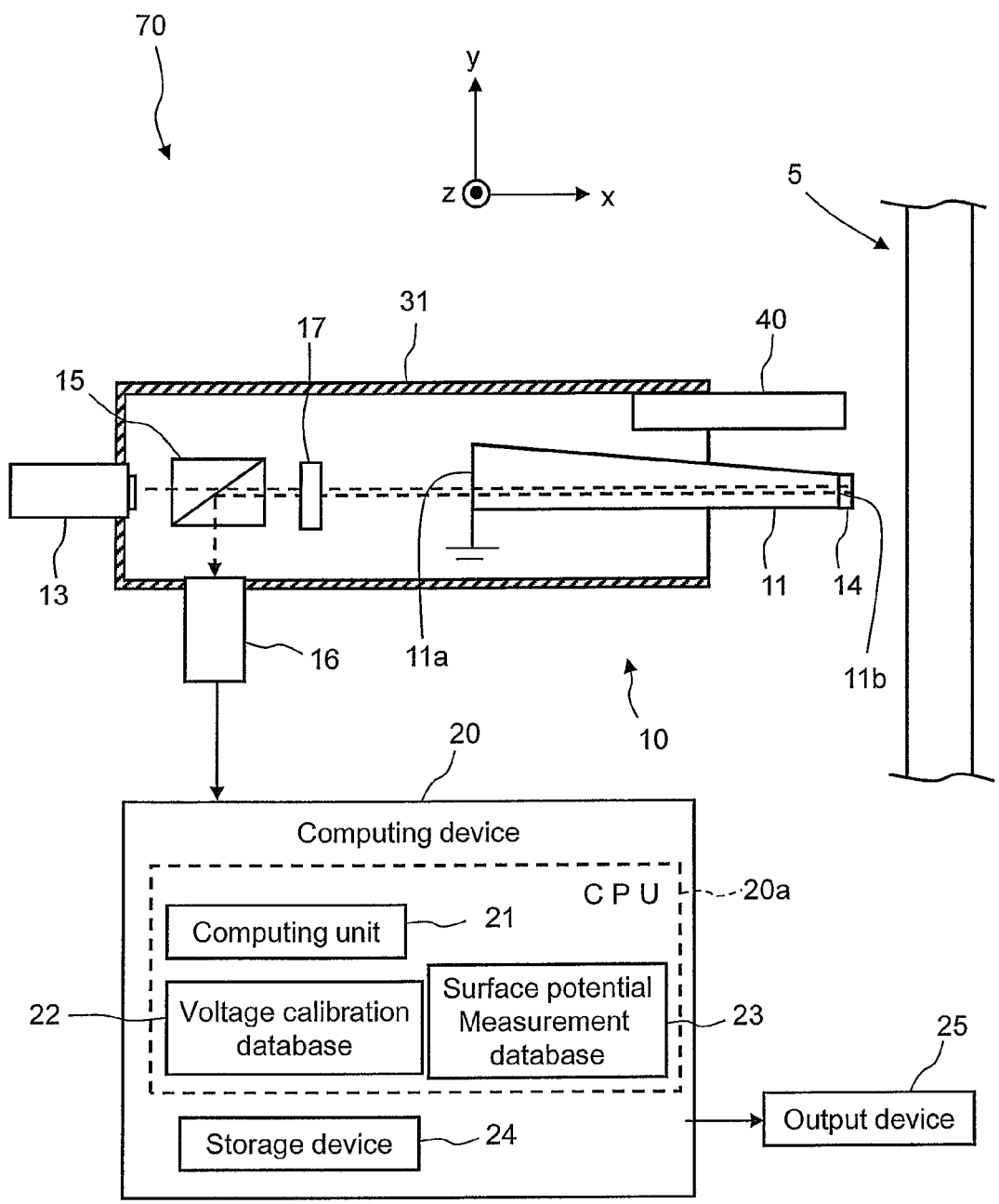
FIG. 2 is a longitudinal sectional view illustrating the configuration of the measurement device of the three-dimensional surface potential distribution measurement system according to the embodiment.

FIG. 2 is a longitudinal sectional view illustrating the configuration of the measurement device of the three-dimensional surface potential distribution measurement system according to the embodiment. The measurement device 70 includes a measurement device main body 10 and a computing device 20.

The measurement device main body 10 includes a Pockels crystal 11, a laser light source 13, a dielectric mirror (hereinafter, referred to merely as "mirror") 14, a polarization beam splitter (hereinafter, abbreviated as "PBS") 15, a photodetector 16, a wavelength plate 17, and a housing 31 that holds the above components. The measurement device main body 10 has a gap sensor 40. The gap sensor 40 is disposed for preventing the Pockels crystal 11 from contacting a measurement object 5 and configured to measure a gap between the Pockels crystal 11 and the measurement object 5, and output a measurement result to the driving controller 50.

The Pockels crystal 11 is an elongated crystal and has a first end surface 11a and a second end surface 11b. The Pockels crystal 11 has such a shape that the cross section thereof is linearly reduced from the first end surface 11a side toward the second end surface 11b side. In the present embodiment, the Pockels crystal 11 has a square shape in cross section perpendicular to the axial direction thereof, and the length of each side of the square is linearly reduced in the x-direction.

The opposing two side surfaces of the four side surfaces of the axially-extending Pockels crystal 11 are parallel to the axial direction, and the remaining two side surfaces are inclined to the axial direction. However, the shape of the Pockels crystal 11 is not limited to this, and it is possible to incline at least one side surface to the axial direction and make the remaining side surfaces parallel to the axial direction so as to axially change the cross-sectional area (cross section).

As illustrated in FIG. 2, the longitudinal direction of the Pockels crystal 11 is referred to as x-direction, a direction in which the object of measurement is scanned is referred to as y-direction, and a direction (direction toward the near side of the paper surface of FIG. 2) perpendicular to the x-direction and y-direction is referred to as z-direction.

The Pockels crystal 11 is an isotropic crystal belonging to "crystal point group $\overline{4}$3 m (4 bar 3 m) or crystal point group 23" producing Pockels effect. The "bar" part "—" of "4 bar" of the "$\overline{4}$3 m (4 bar 3 m)" is a symbol that should be positioned above "4"; however, the "—" cannot be positioned just above "4" for descriptive reasons, so the "—" is described as above.

The Pockels effect is a phenomenon of birefringence that occurs when an isotropic crystal of a dielectric body is placed in an electric field or when voltage is applied thereto. That is, the refractive index changes depending on the applied voltage, to cause the light intensity to change. The Pockels crystal 11 may be a BGO (e.g., $Bi_{12}GeO_{20}$) crystal or the like.

The Pockels crystal 11 can be sensitized to a component that is parallel to or perpendicular to the propagation direction of light of the external electric field depending on a direction formed by the crystal orientation and the propagation direction of the incident light. The former is referred to as longitudinal modulation, and the latter is referred to as transversal modulation.

The Pockels crystal belonging to "crystal point group $\overline{4}$3 m (4 bar 3 m) or crystal point group 23" is a crystal that can be arranged in a longitudinal modulation manner. In the case of the longitudinal modulation arrangement, a change in the light intensity is proportional to the integral value of the component parallel to an optical path of the external electric field, i.e., proportional to voltage.

The Pockels crystal 11 is disposed such that the first end surface 11a thereof faces a side that the laser light enters, and the second end surface 11b thereof faces the measurement object 5 at the time of measurement.

The laser light source 13 emits laser light in the longitudinal direction (x-direction) of the Pockels crystal 11 from the first end surface 11a. For example, the laser light has a wavelength of 532.0 nm, a maximum power of 10 mW, and a diameter of 0.34 mm. In this case, the wavelength of the laser light is set to 532.0 nm; however, the laser light may have a different wavelength as long as the laser light can be propagated through the Pockels crystal 11 and optical components without being significantly attenuated.

The laser light is linearly polarized. The polarization plane of the linearly polarized light is parallel to the incident direction (x-direction) and a direction (z-direction) perpendicular to the scanning direction (y-direction) with respect to the measurement object 5.

The PBS 15 permits only the above-mentioned linearly polarized light to transmit therethrough. The PBS 15 has the laser light emitted from the laser light source 13 transmitting in the incident direction (x-direction). The wavelength plate 17 is an element related to the phase of cosine function representing the detection light intensity Pout as will be described later.

The first end surface 11a of the Pockels crystal 11 is grounded, or the first end surface 11a of the Pockels crystal 11 is set at 0 [V] by a power supply device.

The laser light from the PBS 15 enters the first end surface 11a of the Pockels crystal 11, travels in the Pockels crystal 11, and then reaches the second end surface 11b.

In a measurement state, the second end surface 11b of the Pockels crystal 11 that the surface of the mirror 14 contacts is applied with a voltage under the influence of an electromagnetic field around the measurement object 5.

The rear surface of the mirror 14 is located spaced apart from the measurement object 5 by a predetermined distance. The predetermined distance is set in consideration of factors such as degree of irregularity of resin on the surface of the measurement object 5 and spatial resolution.

The mirror 14 is disposed so as to be attached firmly to the second end surface 11b of the Pockels crystal 11. The mirror 14 reflects the laser light traveling in the Pockels crystal 11 and reaching the second end surface 11b, in a direction opposite to the x-direction.

The light intensity of the laser light reflected by the mirror 14 corresponds to an output voltage V which is a potential difference between the first end surface 11a and the second end surface 11b of the Pockels crystal 11.

The PBS 15 receives the laser light reflected by the mirror 14 and bends the traveling direction thereof 90 degrees, or in a direction opposite to the y-direction.

The photodetector 16 has a band following a high-frequency component. The photodetector 16 is disposed in the longitudinal direction y (more specifically, in the present embodiment, the opposite direction to the longitudinal direction y) with respect to the PBS 15. The photodetector 16 receives the laser light whose traveling direction has been changed by the PBS 15. The photodetector 16 detects a detection light intensity Pout as the light intensity of the laser light. The wavelength plate 17 is an element related to the phase of cosine function representing the detection light intensity Pout as described later.

The detection light intensity Pout corresponds to the output voltage V which is a potential difference between the first end surface 11a and the second end surface 11b of the Pockels crystal 11. The detection light intensity Pout is represented by the following expression as a cosine function of the output voltage V:

$$Pout=(Pin/2)\times\{1-\cos(\pi(V/V\pi)-\theta 0)\}.$$

In the cosine function, Pin is an incident light intensity of the Pockels crystal 11, $V\pi$ is a half wavelength voltage, and $\theta 0$ is a phase difference (arbitrary value) provided by the wavelength plate 17. In the present embodiment, the output voltage V of the Pockels crystal 11 is computed based on the detection light intensity Pout and according to an inverse function of the above cosine function.

As the Pockels crystal 11, a comparatively long crystal of 100 mm is used, so that disturbance of the electric field distribution on the surface of the dielectric body due to approach of the Pockels crystal 11 is small. Therefore, the output voltage V of the Pockels crystal 11 is proportional to the surface potential of the measurement object 5.

The computing device 20 is a computer connected to the photodetector 16 and an output device 25. The computing device 20 includes a CPU (Central Processing Unit) 20a and a storage device 24.

The storage device 24 stores a computer program. The CPU 20a reads out the computer program from the storage device 24 and executes the computer program. As the output device 25, a display and a printer can be exemplified.

The computing device 20 includes, as functional blocks of the CPU 20a, a computing unit 21, a voltage calibration database 22, and a surface potential measurement database 23. The computing device 20 is connected to the output device 25 and outputs a computing result to the output device 25.

The following describes an operation of the measurement device 70 of the three-dimensional surface potential distribution measurement system 100 according to the present embodiment.

The measurement device 70 performs voltage calibration processing to be described later before execution of a test, and then performs surface potential measurement processing to be described later during the test. The computing unit 21 constructs the voltage calibration database 22 through the voltage calibration processing, and refers to the voltage calibration database 22 during the surface potential measurement processing. To the computing unit 21, the voltage calibration processing or surface potential measurement processing is set by, e.g., an input operation of an operator.

As illustrated in FIG. 1, the three-dimensional motion-driver 30 includes a direction-changing rotation driver 32, a radial direction driver 33, a circumferential direction driver 34, a center shaft 37, and center shaft supports 38a and 38b.

Both ends of the center shaft 37 are supported and fixed to the center shaft supports 38a and 38b. The circumferential direction driver 34 is mounted to the center shaft 37 so as to be rotatable around and axially movable along the center shaft 37. The radial direction driver 33 is fixed and supported to the circumferential direction driver 34, and the peripheral angle and axial position of the radial direction driver 33 is determined by the motion of the circumferential direction driver 34.

The direction-changing rotation driver 32 is supported by the radial direction driver 33 through an axial direction arm 36. The radial direction driver 33 can radially move a support part of the axial direction arm 36. The radial movement can be achieved by using a rack and pinion mechanism. The direction-changing rotation driver 32 supports the housing 31 that holds the measurement device main body 10 through a rotation driver arm 35.

When a target portion of the measurement object 5 is specified, the driving controller 50 computes a changing operation amount from the current position of each of the above units of the three-dimensional motion-driver 30 so as to control the position and posture of the three-dimensional motion-driver 30 such that the Pockels crystal 11 of the measurement device main body 10 faces the target portion with an appropriate gap therefrom. The driving controller 50 sequentially outputs the computing results as operation command to the units thereof.

When the Pockels crystal 11 reaches a position facing the target portion of the measurement object 5, the driving controller 50 uses a signal from the gap sensor 40 as a feedback signal and controls the three-dimensional motion-driver 30 such that the value of the signal is set to a predetermined gap value. The predetermined value is set in consideration of the measurement sensitivity of the measurement device main body 10, a surface condition of the measurement object 5, and the like.

The measurement device main body 10 can be three-dimensionally moved by the thus configured three-dimensional motion-driver 30.

The following describes a case where the three-dimensional surface potential distribution measurement system 100 is used for measuring the surface potential distribution of a stator coil conductor 3 (FIG. 5) of a stator 1 (FIG. 5) of a rotating electrical machine.

Figure 3:
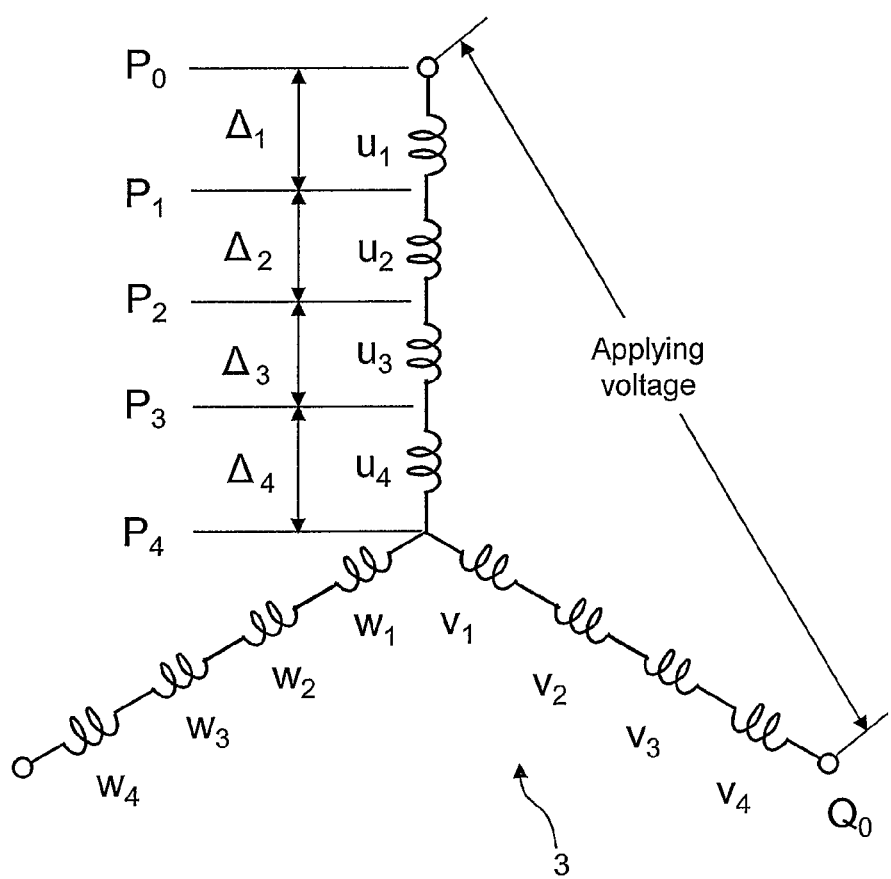
FIG. 3 is a circuit diagram illustrating a configuration example of stator windings of a rotating electrical machine.

FIG. 3 is a circuit diagram illustrating a configuration example of stator windings of a rotating electrical machine. A high-frequency test voltage or a pulse voltage is applied between a U-phase coil entrance $P_0$ and a V-phase coil entrance $Q_0$ of a three-phase stator coil conductor 3, and the potential distribution of the U-phase stator coil conductor 3 is measured. When the U-phase is constituted of four series-connected coils $u_1$, $u_2$, $U_3$, and $u_4$, potential differences $\Delta_1$, $\Delta_2$, $\Delta_3$, and $\Delta_4$ applied respectively to the $u_1$, $u_2$, $u_3$, and $u_4$ are measured.

Figure 5:
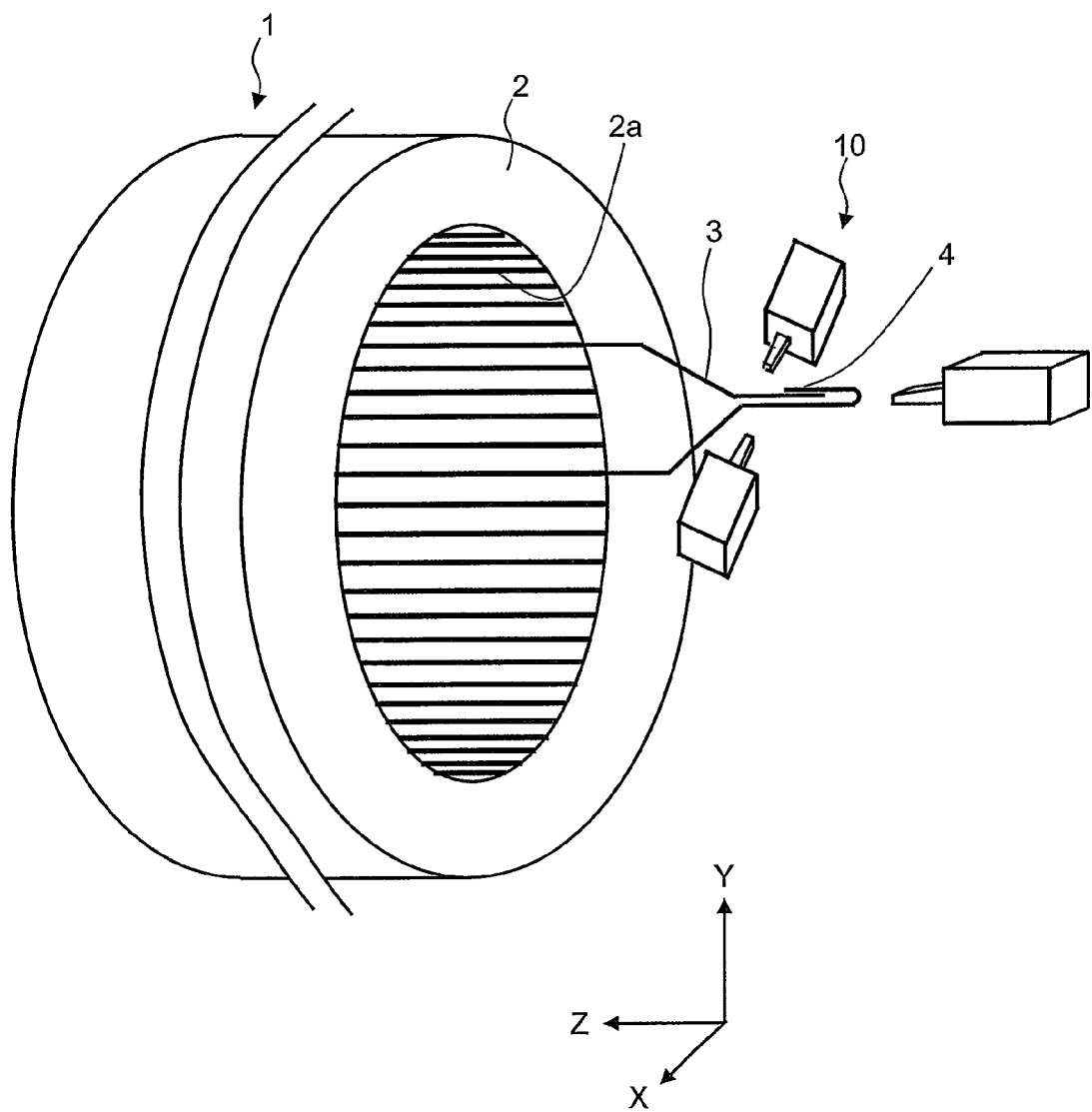
FIG. 5 is a perspective view for explaining requirements for measurement of the potential distribution on the stator windings of the rotating electrical machine.

Each coil is housed in slots 2a formed in a stator core 2 (FIG. 5). Thus, it is necessary to measure the potential at the coil entrance $P_0$ and points $P_1$, $P_2$, $P_3$, and $P_4$ between coils.

Figure 4:
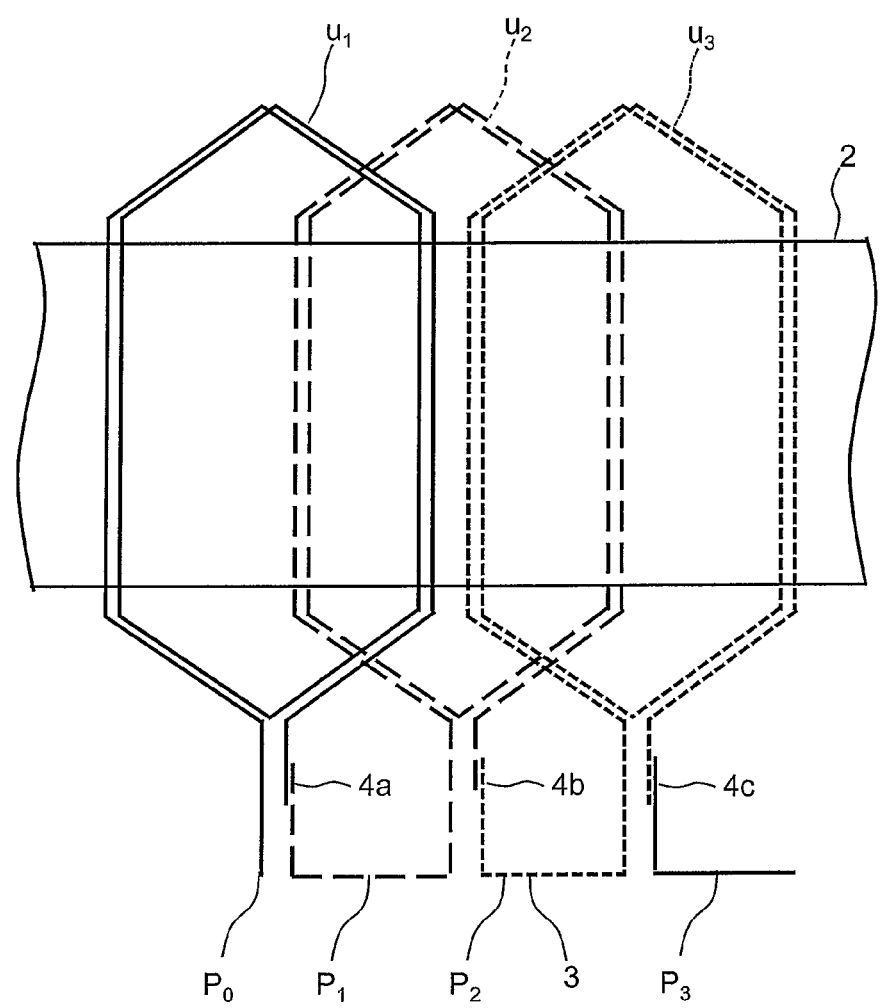
FIG. 4 is a developed view of a part of the circumferential direction, which illustrates a connection example of the stator windings of the rotating electrical machine.

FIG. 4 is a developed view of a part of the circumferential direction, which illustrates a connection example of the stator windings of the rotating electrical machine. In FIG. 4, the coils $u_1$, $u_2$, and $u_3$ of the U-phase coil are illustrated. In this example, the surface potential is measured at the coil entrance $P_0$ and points $P_1$, $P_2$, and $P_3$ between coils which are axially outer portions of the stator core 2.

The coil $u_1$ and the coil $u_2$ are connected at a connection part 4a. The coil $u_2$ and the coil $u_3$ are connected at a connection part 4b. The coil $u_3$ and the coil $u_4$ are connected at a connection part 4c.

At each of the connection parts 4a, 4b, and 4c, two stator coil conductors 3 overlap each other, and an insulating coating impregnated with resin is wound around each connection part. The degree of overlap of the two stator coil conductors at each connection part differs from place to place, and thus, the connection part is not appropriate as the measurement point of the surface potential.

Therefore, it is necessary to set the position and posture of the measurement device main body 10 to a direction appropriate for measurement of the surface potential at each point.

FIG. 5 is a perspective view for explaining requirements for measurement of the potential distribution on the stator windings of the rotating electrical machine. As illustrated in FIG. 5, a part of the stator coil conductor 3 outside the slot 2a of the stator core 2, except the connection part 4, is needed to be measured, with the second end surface 11b of the Pockels crystal 11 spaced apart from the insulated surface of the stator coil conductor 3 by a predetermined distance for measurement.

For this purpose, it is necessary to allow the measurement device main body 10 of the three-dimensional surface potential distribution measurement system 100 to face the stator coil conductor 3 which is the measurement object 5 in all of the following directions: a direction from axially outside (negative z-axis direction) toward axially inside; a direction from radially inside toward radially outside; and a direction from radially outside toward radially inside.

Figure 6:
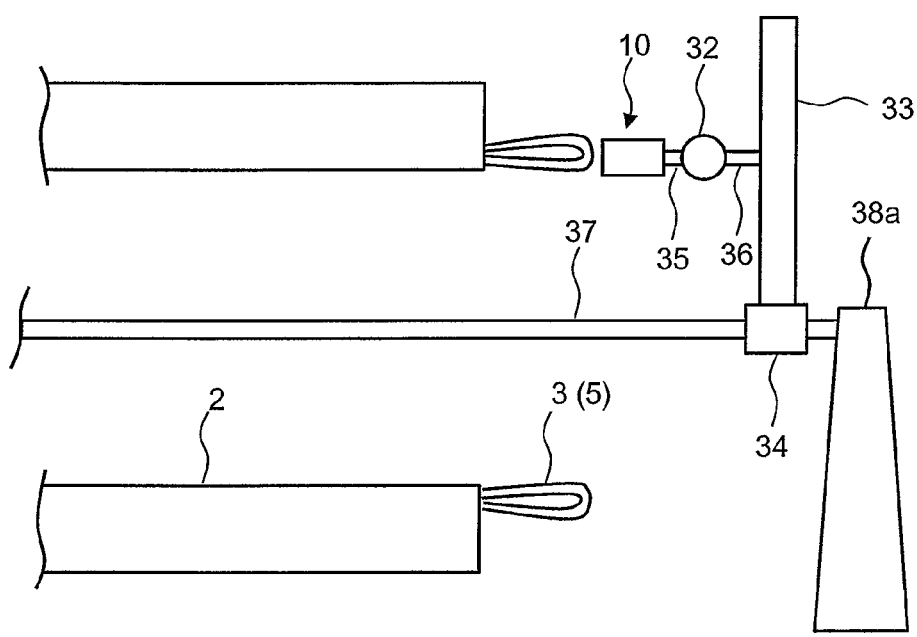
FIG. 6 is a side view illustrating a first state of the three-dimensional motion-driver during measurement of the potential distribution on the stator windings of the rotating electrical machine.

FIG. 6 is a side view illustrating a first state of the three-dimensional motion-driver during measurement of the potential distribution on the stator windings of the rotating electrical machine. The direction-changing rotation driver 32 assumes a rotation position such that the rotation driver arm 35 and the axial direction arm 36 are linearly aligned. The radial direction driver 33 sets the axial direction arm 36 to a radial position corresponding to the radial position of the stator coil conductor 3. The circumferential direction driver 34 sets the axial position thereof to an appropriate position. As a result, the measurement device main body 10 is set to a position at which it can measure the stator coil conductor 3 from the axially outside thereof.

Figure 7:
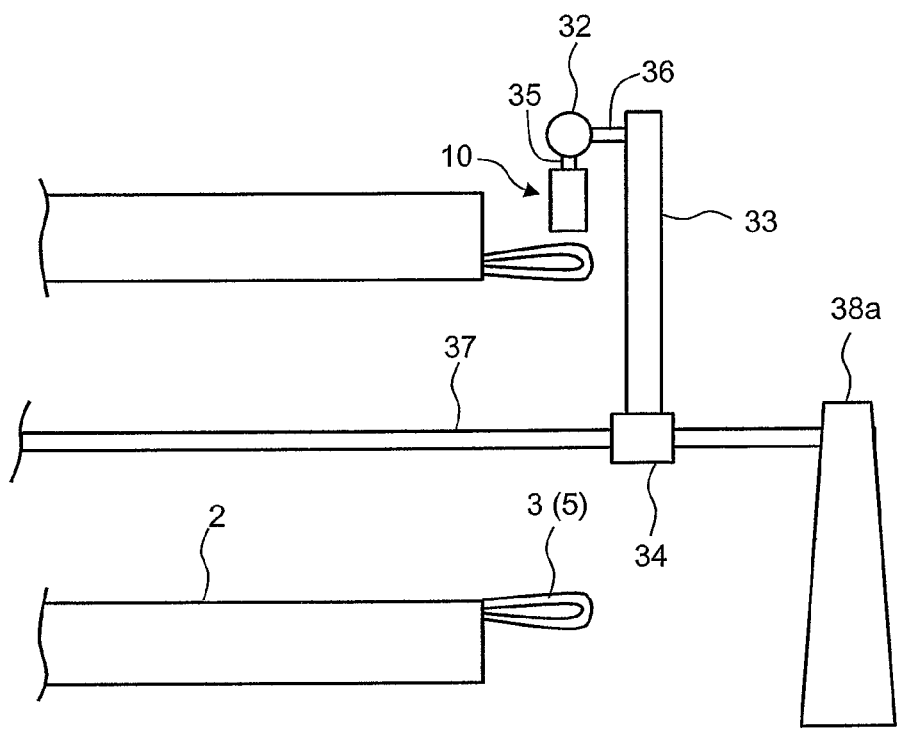
FIG. 7 is a side view illustrating a second state of the three-dimensional motion-driver during measurement of the potential distribution on the stator windings of the rotating electrical machine.

FIG. 7 is a side view illustrating a second state of the three-dimensional motion-driver during measurement of the potential distribution on the stator windings of the rotating electrical machine. The direction-changing rotation driver 32 assumes a rotation position such that the axial direction arm 36 is parallel to the axial direction and that the rotation driver arm 35 is directed toward the axial center. The radial direction driver 33 sets the axial direction arm 36 to a radial position outside the radial position of the stator coil conductor 3. The circumferential direction driver 34 sets the axial position thereof to an appropriate position. As a result, the measurement device main body 10 is set to a position at which it can measure the stator coil conductor 3 from the axially outside thereof.

Figure 8:
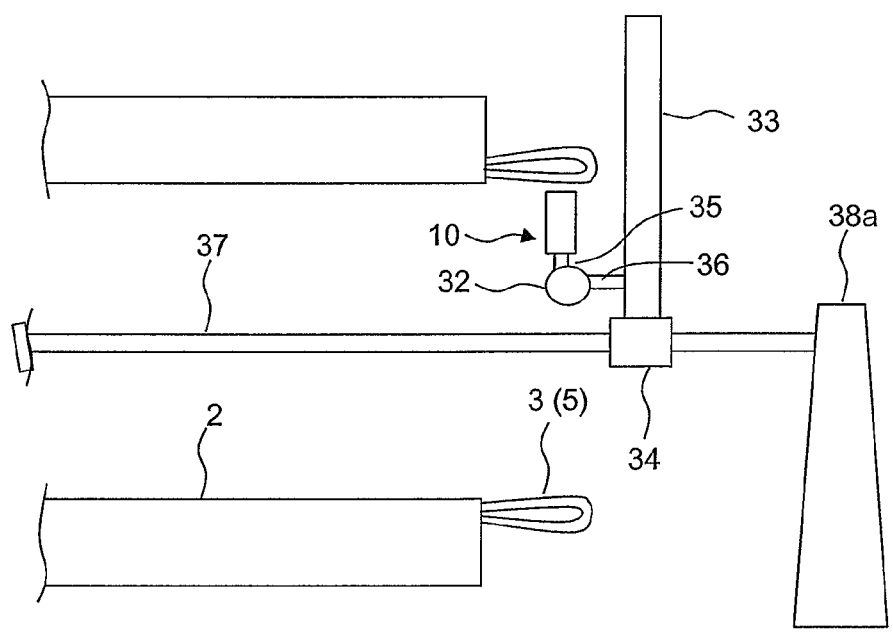
FIG. 8 is a side view illustrating a third state of the three-dimensional motion-driver during measurement of the potential distribution on the stator windings of the rotating electrical machine.

FIG. 8 is a side view illustrating a third state of the three-dimensional motion-driver during measurement of the potential distribution on the stator windings of the rotating electrical machine. The direction-changing rotation driver 32 assumes a rotation position such that the axial direction arm 36 is parallel to the axial direction and that the rotation driver arm 35 is directed outward from the axial center. The axial direction arm 36 is set to an appropriate position by the radial direction driver 33, and the circumferential direction driver 34 sets the axial position thereof to an appropriate position. As a result, the measurement device main body 10 is set to a position at which it can measure the stator coil conductor 3 from the axially inside thereof.

Figure 9:
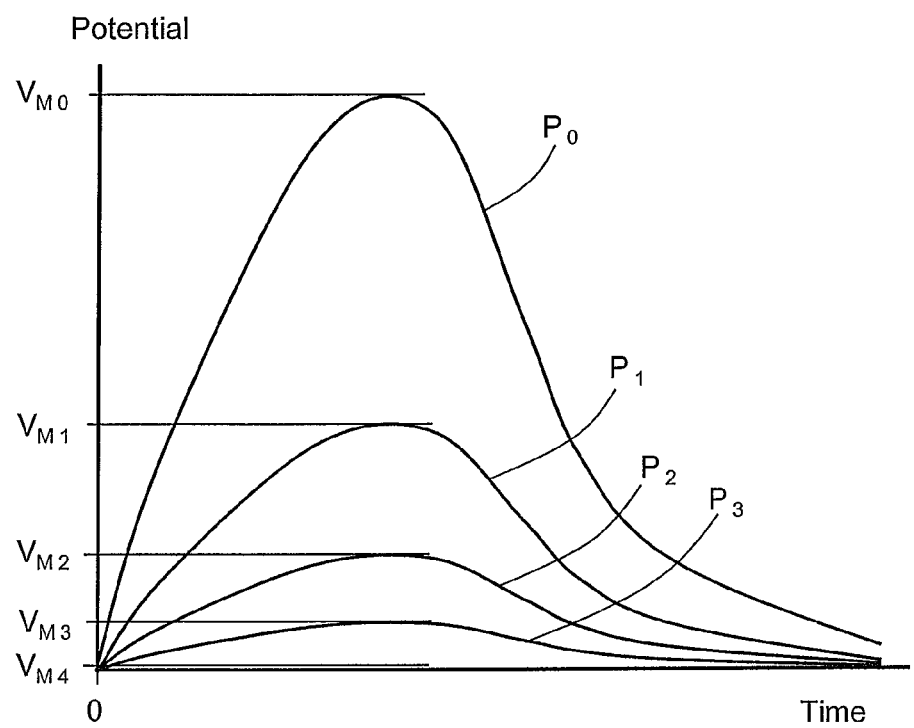
FIG. 9 is a graph illustrating an example of measurement results of the potential on the stator windings of the rotating electrical machine.

FIG. 9 is a graph illustrating an example of measurement results of the potential on the stator windings of the rotating electrical machine. The horizontal axis represents time, and the vertical axis represents potentials measured at respective measurement points. The time bases of the test results are aligned with a time point at which a test pulse voltage is applied as "0".

Figure 10:
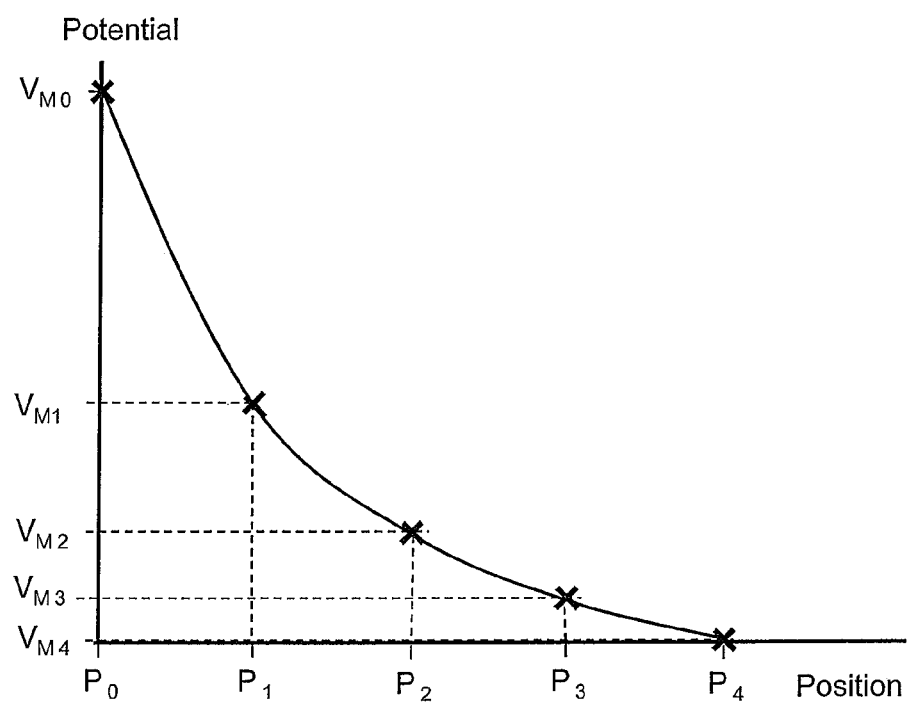
FIG. 10 is a graph illustrating an example of a distribution of peak values obtained as measurement result of the potential on the stator windings of the rotating electrical machine.

FIG. 10 is a graph illustrating an example of a distribution of peak values obtained as measurement result of the potential on the stator windings of the rotating electrical machine. Horizontal axis represents positions of $P_0$, $P_1$, $P_2$, $P_3$, and $P_4$ which are the measurement points, and vertical axis represents peak values of potential obtained as measurement results at the respective measurement points in FIG. 9. In this manner, the potential distribution at measurement points when a test voltage is applied in the test, i.e., the potential distribution in the measurement object can be measured.

As described above, in a system using a series coil, a sharing voltage on the surface of a coil of an actual machine after impregnation can be measured in a test where a voltage including a high-frequency component is applied.

Other Embodiments

While the embodiments of the present invention have been described, those embodiments are presented by way of example only and not intended to limit the scope of the invention. Furthermore, the above-described embodiments may be put to use in various different ways and, if appropriate, any of the components thereof may be omitted, replaced or altered in various different ways without departing from the spirit and scope of the invention.

For example, what has been described in the embodiment is the case of the series impregnated coils, the present invention is not limited to this. For example, the present invention may be applied to the case of pre-impregnated type series coils, formed by winding impregnated insulating tapes.

All the above-described embodiments and the modifications made to them are within the spirit and scope of the present invention, which is specifically defined by the appended claims, as well as their equivalents.

EXPLANATION OF REFERENCE SYMBOLS

1: stator, 2: stator core, 2a: slot, 3: stator coil conductor, 4, 4a, 4b, 4c: connection part, 5: measurement object, 10: measurement device main body, 11: Pockels crystal, 11a: first end surface, 11b: second end surface, 13: laser light source, 14: dielectric mirror, 15: polarization beam splitter (PBS), 16: photo detector, 17: wavelength plate, 20: computing device, 21: computing unit, 22: voltage calibration database, 23: surface potential measurement database, 24: storage device, 25: output device, 30: three-dimensional motion-driver, 31: housing, 32: direction-changing rotation driver, 33: radial direction driver, 34: circumferential direction driver, 35: rotation driver arm, 36: axial direction arm, 37: center shaft, 38a, 38b: center shaft support, 40: gap sensor, 50: driving controller, 70: measurement device, 100: three-dimensional surface potential distribution measurement system

What is claimed is:

1. A three-dimensional surface potential distribution measurement system for measuring a surface potential of a stator coil conductor located outside an axial end portion of a stator core of a rotating electrical machine, the system comprising:
    a laser light source to emit laser light;
    a Pockels crystal having a first end surface and a second end surface, exhibiting Pockels effect in which a refractive index changes depending on potential difference between the first end surface and the second end surface, disposed such that the first end surface faces a side that the laser light emitted from the laser light source enters while the second end surface faces the stator coil conductor, and extending in a longitudinal direction along a propagation direction of the laser light;
    a mirror disposed on the second end surface and configured to reflect the laser light incident from the first end surface of the Pockels crystal in a direction opposite to a laser light incident direction;
    a photodetector having a band following a high-frequency component of an inverter pulse voltage and configured to receive the laser light reflected by the mirror to detect a light intensity of the laser light corresponding to the potential difference between the first end surface and the second end surface of the Pockels crystal;
    a housing that holds the laser light source, the Pockels crystal, the mirror, and the photodetector while maintaining a relative positional relationship thereamong;
    a three-dimensional motion-driver capable of three-dimensionally moving the housing and configured to move the Pockels crystal to a position where a surface of the stator coil conductor can be measured from radially outside, radially inside, and axially outside the stator coil conductor; and
    a driving controller that controls the three-dimensional motion-driver,
    wherein the three-dimensional motion-driver includes:
        a center shaft extending horizontally, the shaft being externally fixed to a center axis position of the stator core so as to be immovable,
        a circumferential direction driver supported by the center shaft and configured to be rotatable around and axially movable along the center shaft,
        a radial direction driver supported by the circumferential direction driver, and
        a direction-changing rotation driver supported by the radial direction driver, configured to be changed in a radial position by the radial direction driver, and configured to change a direction of the Pockels crystal.

2. The three-dimensional surface potential distribution measurement system according to claim 1, wherein
    the housing has a gap sensor configured to be moved integrally with the Pockels crystal and measure a gap between the Pockels crystal and the surface of the stator coil conductor, and
    a gap signal output from the gap sensor is input to the driving controller.

3. The three-dimensional surface potential distribution measurement system according to claim 1, wherein the Pockels crystal is formed in a tapered manner from the first end surface toward the second end surface.

4. The three-dimensional surface potential distribution measurement system according to claim 1, wherein the Pockels crystal is a BGO crystal.

* * * * *